US011037636B2

(12) United States Patent
Piccardi et al.

(10) Patent No.: US 11,037,636 B2
(45) Date of Patent: Jun. 15, 2021

(54) MEMORY DEVICES INCLUDING VOLTAGE GENERATION SYSTEMS

(71) Applicant: MICRON TECHNOLOGY, INC., Boise, ID (US)

(72) Inventors: Michele Piccardi, Cupertino, CA (US); Kalyan C. Kavalipurapu, Santa Clara, CA (US); Xiaojiang Guo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/016,946

(22) Filed: Sep. 10, 2020

(65) Prior Publication Data

US 2020/0411119 A1 Dec. 31, 2020

Related U.S. Application Data

(63) Continuation of application No. 16/411,210, filed on May 14, 2019, now Pat. No. 10,796,773.

(51) Int. Cl.
*G11C 16/30* (2006.01)
*G11C 5/14* (2006.01)
(Continued)

(52) U.S. Cl.
CPC .............. *G11C 16/30* (2013.01); *G11C 5/144* (2013.01); *G11C 5/145* (2013.01); *G11C 5/147* (2013.01);
(Continued)

(58) Field of Classification Search
CPC ......... G11C 5/144; G11C 5/145; G11C 5/147; G11C 7/1063; G11C 16/08; G11C 16/16; G11C 16/26; G11C 16/30
(Continued)

(56) References Cited

U.S. PATENT DOCUMENTS 6,577,535 B2 * 6/2003 Pasternak ................ G11C 5/14
  365/185.11
7,619,945 B2 * 11/2009 Norman ................ G11C 5/145
  365/189.09
(Continued)

FOREIGN PATENT DOCUMENTS

EP 2966573 A1 1/2016

OTHER PUBLICATIONS

International Search Report and Written Opinion of the International Searching Authority for Application No. PCT/US2020/029196 dated Jul. 6, 2020 (10 pages).

*Primary Examiner* — Son L Mai
(74) *Attorney, Agent, or Firm* — Dicke, Billig & Czaja, PLLC

(57) ABSTRACT

A memory device includes a memory array comprising a plurality of planes, a plurality of voltage generation systems, and a controller. Each voltage generation system of the plurality of voltage generation systems is electrically coupled to a corresponding plane of the plurality of planes. The controller is configured to turn on each voltage generation system of the plurality of voltage generation systems in response to a first command to access a first plane of the plurality of planes. The controller is configured to operate the voltage generation system of the plurality of voltage generation systems corresponding to the first plane of the plurality of planes at a first clock frequency, and operate the remaining voltage generation systems of the plurality of voltage generation systems corresponding to the other planes of the plurality of planes at a second clock frequency less than the first clock frequency.

20 Claims, 11 Drawing Sheets

(51) Int. Cl.
*G11C 7/10* (2006.01)
*G11C 16/08* (2006.01)
*G11C 16/16* (2006.01)
*G11C 16/26* (2006.01)

(52) U.S. Cl.
CPC ............ *G11C 7/1063* (2013.01); *G11C 16/08* (2013.01); *G11C 16/16* (2013.01); *G11C 16/26* (2013.01)

(58) Field of Classification Search
USPC ................................ 365/185.11, 189.09, 226
See application file for complete search history.

(56) References Cited

U.S. PATENT DOCUMENTS

| | | | |
|---|---|---|---|
| 8,325,532 B2 * | 12/2012 | Makino | G11C 16/30 365/185.18 |
| 8,400,807 B2 | 3/2013 | Yoko | |
| 8,489,902 B2 | 7/2013 | Ko et al. | |
| 8,885,430 B2 | 11/2014 | Sato et al. | |
| 9,093,167 B2 * | 7/2015 | Jung | G11C 5/145 |
| 9,343,117 B1 | 5/2016 | Lee | |
| 9,496,042 B1 | 11/2016 | Abiko et al. | |
| 9,755,503 B2 | 9/2017 | Kim et al. | |
| 10,120,404 B2 | 11/2018 | Tanadi | |
| 10,224,092 B2 * | 3/2019 | Park | G11C 11/4076 |
| 10,497,447 B2 | 12/2019 | Shin | |
| 10,672,485 B2 * | 6/2020 | Arakawa | G11C 16/0483 |
| 2008/0204234 A1 | 8/2008 | Pillai | |
| 2015/0255149 A1 | 9/2015 | Nango et al. | |

* cited by examiner

|  $270_0$ | $270_1$ | $270_2$ | $270_3$ |
|---|---|---|---|
| Block$_0$ $250_0$ | Block$_0$ $250_0$ | Block$_0$ $250_0$ | Block$_0$ $250_0$ |
| Block$_1$ $250_1$ | Block$_1$ $250_1$ | Block$_1$ $250_1$ | Block$_1$ $250_1$ |
| Block$_2$ $250_2$ | Block$_2$ $250_2$ | Block$_2$ $250_2$ | Block$_2$ $250_2$ |
| Block$_3$ $250_3$ | Block$_3$ $250_3$ | Block$_3$ $250_3$ | Block$_3$ $250_3$ |
| Block$_4$ $250_4$ | Block$_4$ $250_4$ | Block$_4$ $250_4$ | Block$_4$ $250_4$ |
| ⋮ | ⋮ | ⋮ | ⋮ |
| Block$_{L-4}$ $250_{L-4}$ | Block$_{L-4}$ $250_{L-4}$ | Block$_{L-4}$ $250_{L-4}$ | Block$_{L-4}$ $250_{L-4}$ |
| Block$_{L-3}$ $250_{L-3}$ | Block$_{L-3}$ $250_{L-3}$ | Block$_{L-3}$ $250_{L-3}$ | Block$_{L-3}$ $250_{L-3}$ |
| Block$_{L-2}$ $250_{L-2}$ | Block$_{L-2}$ $250_{L-2}$ | Block$_{L-2}$ $250_{L-2}$ | Block$_{L-2}$ $250_{L-2}$ |
| Block$_{L-1}$ $250_{L-1}$ | Block$_{L-1}$ $250_{L-1}$ | Block$_{L-1}$ $250_{L-1}$ | Block$_{L-1}$ $250_{L-1}$ |
| Block$_L$ $250_L$ | Block$_L$ $250_L$ | Block$_L$ $250_L$ | Block$_L$ $250_L$ |
| $240_0$ | $240_1$ | $240_2$ | $240_3$ |

MEMORY DEVICES INCLUDING VOLTAGE GENERATION SYSTEMS

RELATED APPLICATION

This application is a Continuation of U.S. application Ser. No. 16/411,210, titled "MEMORY DEVICES INCLUDING VOLTAGE GENERATION SYSTEMS," filed May 14, 2019, (Allowed) which is commonly assigned and incorporated herein by reference.

TECHNICAL FIELD

The present disclosure relates generally to the control of voltage generation systems and, in particular, in one or more embodiments, the present disclosure relates to apparatus and methods for controlling voltage generation systems in memory devices.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

Memory devices may include voltage generation systems that supply voltages for operating the memory devices. The voltage generation systems may need to be turned on and warmed up prior to use and turned off and placed into an idle state when not in use. These turn on and turn off periods for the voltage generation systems may increase the time required for accessing a memory device.

For the reasons stated above, and for other reasons stated below which will become apparent to those skilled in the art upon reading and understanding the present specification, there is a need in the art for alternative methods for controlling voltage generation systems in memory devices.

BRIEF DESCRIPTION OF THE DRAWINGS

FIGS. 2A-2D are schematic diagrams of portions of an array of memory cells as could be used in a memory device of the type described with reference to FIG. 1.

DETAILED DESCRIPTION

Figure 1:
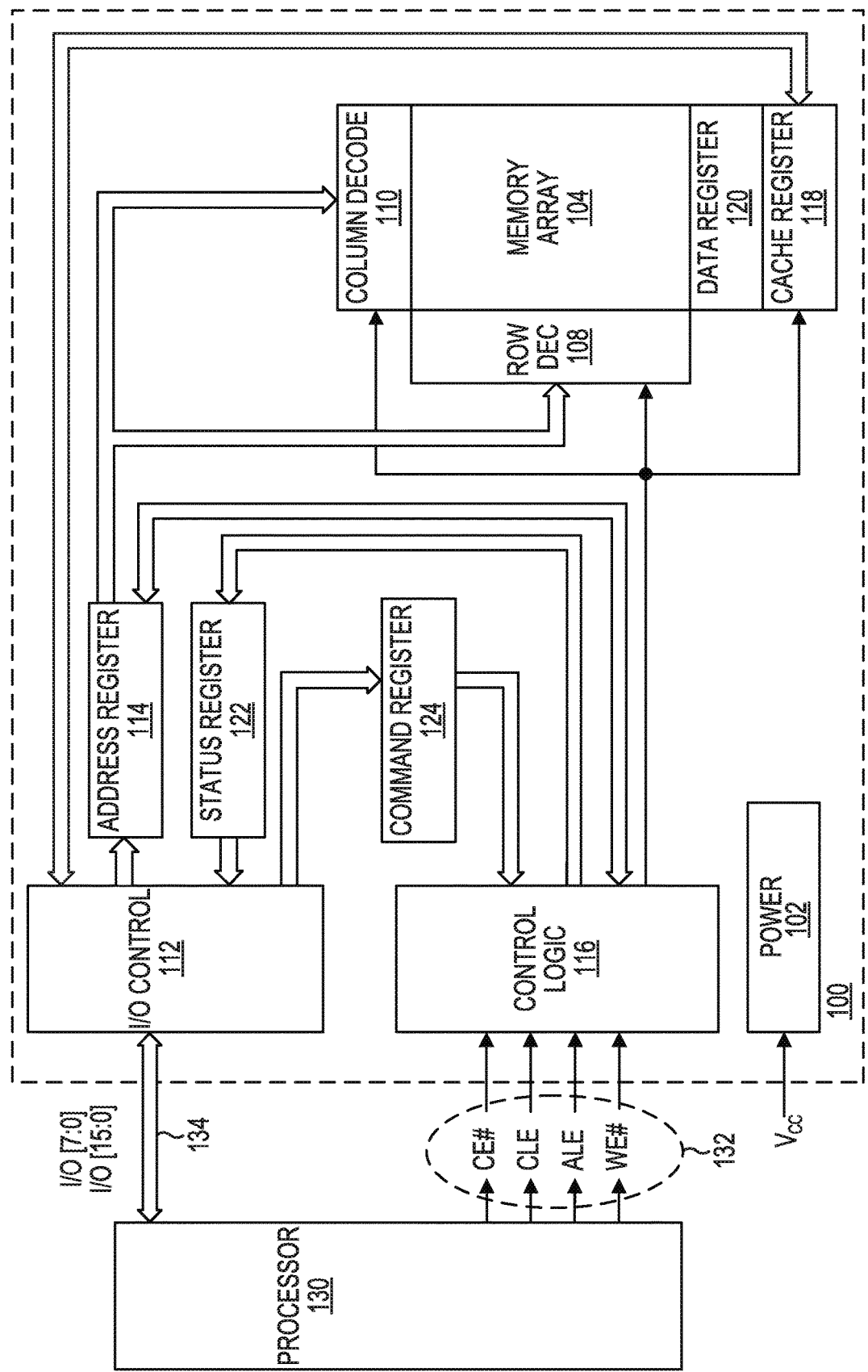
FIG. 1 is a simplified block diagram of one example of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Disclosed herein are apparatus and methods for controlling voltage generation systems of memory devices to reduce the time needed to access a memory device for read, program, and/or erase operations. A memory device may include a memory array including a plurality of planes and a plurality of voltage generation systems, where each voltage generation system corresponds to a plane. The term plane in this context includes the concept of plane group (e.g., a group of single planes). Each voltage generation system of the memory device may be turned on and warmed up in response to a first command to access any one of the planes of the memory array. Each voltage generation system may remain on until no commands to access any plane of the memory array are being processed. Once all commands have been processed, each voltage generation system may be turned off and slowly discharged to an idle state. By turning on each voltage generation system in response to the first command, subsequent commands may be processed without delay. In addition, by slowly discharging each voltage generation system in response to no commands being processed, if a subsequent command is received prior to the voltage generation systems reaching the idle state, the warm up period may be reduced.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes power circuitry 102. Power circuitry 102 may include a plurality of voltage generation systems that receive a supply voltage (e.g., $V_{CC}$) and provide regulated voltages (e.g., boosted voltages) for operating memory device 100. The voltage generation systems may be controlled to reduce the time needed for read, program, and/or erase operations. In one example, the supply voltage $V_{CC}$ is between 2.7 volts and 3.6 volts. In another example, the supply voltage $V_{CC}$ is between 2.35 volts and 2.7 volts or another suitable voltage depending on the application.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes I/O control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
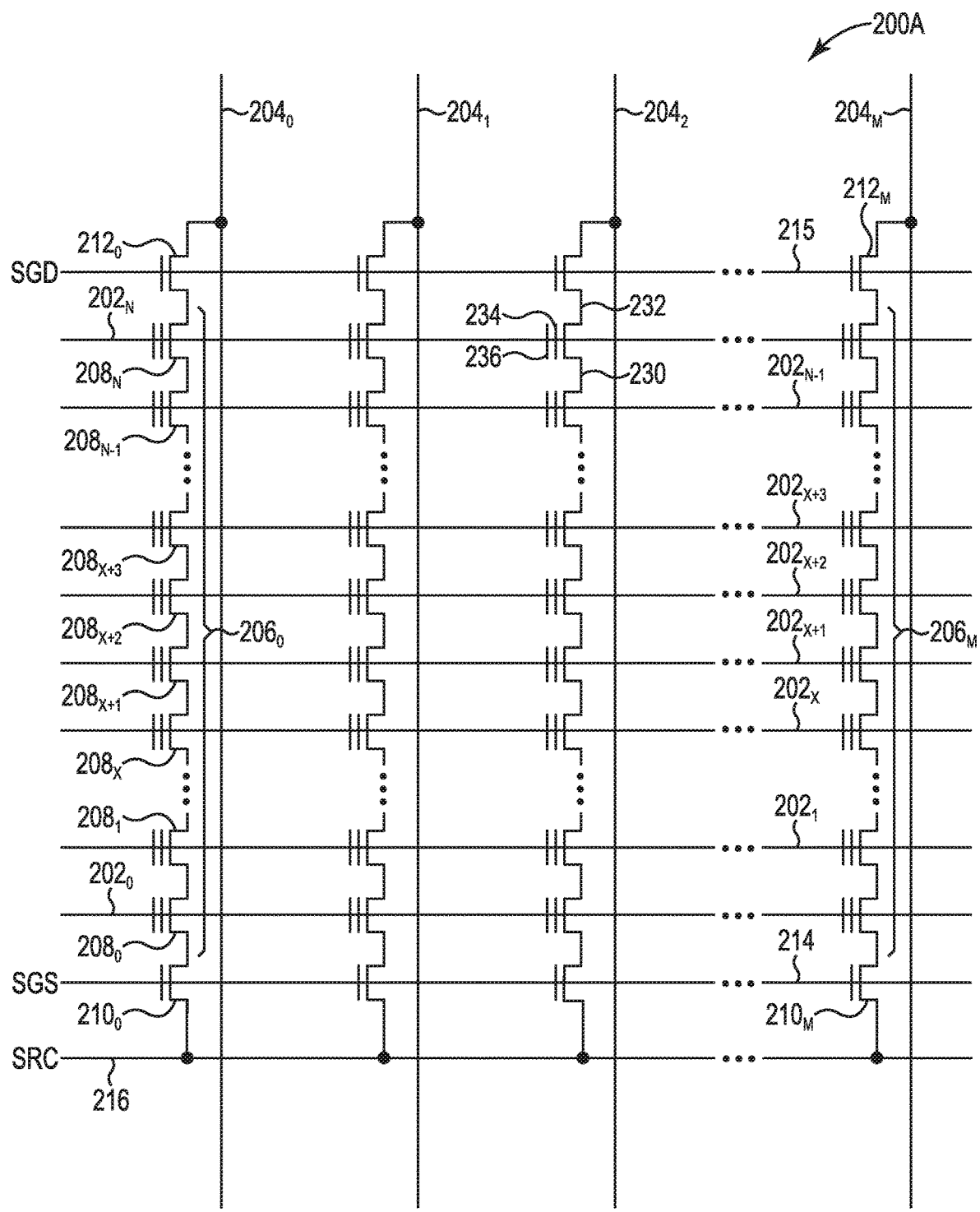

FIG. 2A is a schematic of a NAND memory array 200A, e.g., as a portion of array of memory cells 104. Memory array 200A includes access lines, such as word lines $202_0$ to $202_N$, and data lines, such as bit lines $204_0$ to $204_M$. The word lines 202 may be coupled to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206.

For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2A might be a quasi-two-dimensional memory array and might have a generally planar structure, e.g., where the common source 216, strings 206 and bit lines 204 extend in substantially parallel planes. Alternatively, the memory array in FIG. 2A might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2A. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$ $204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 2B:
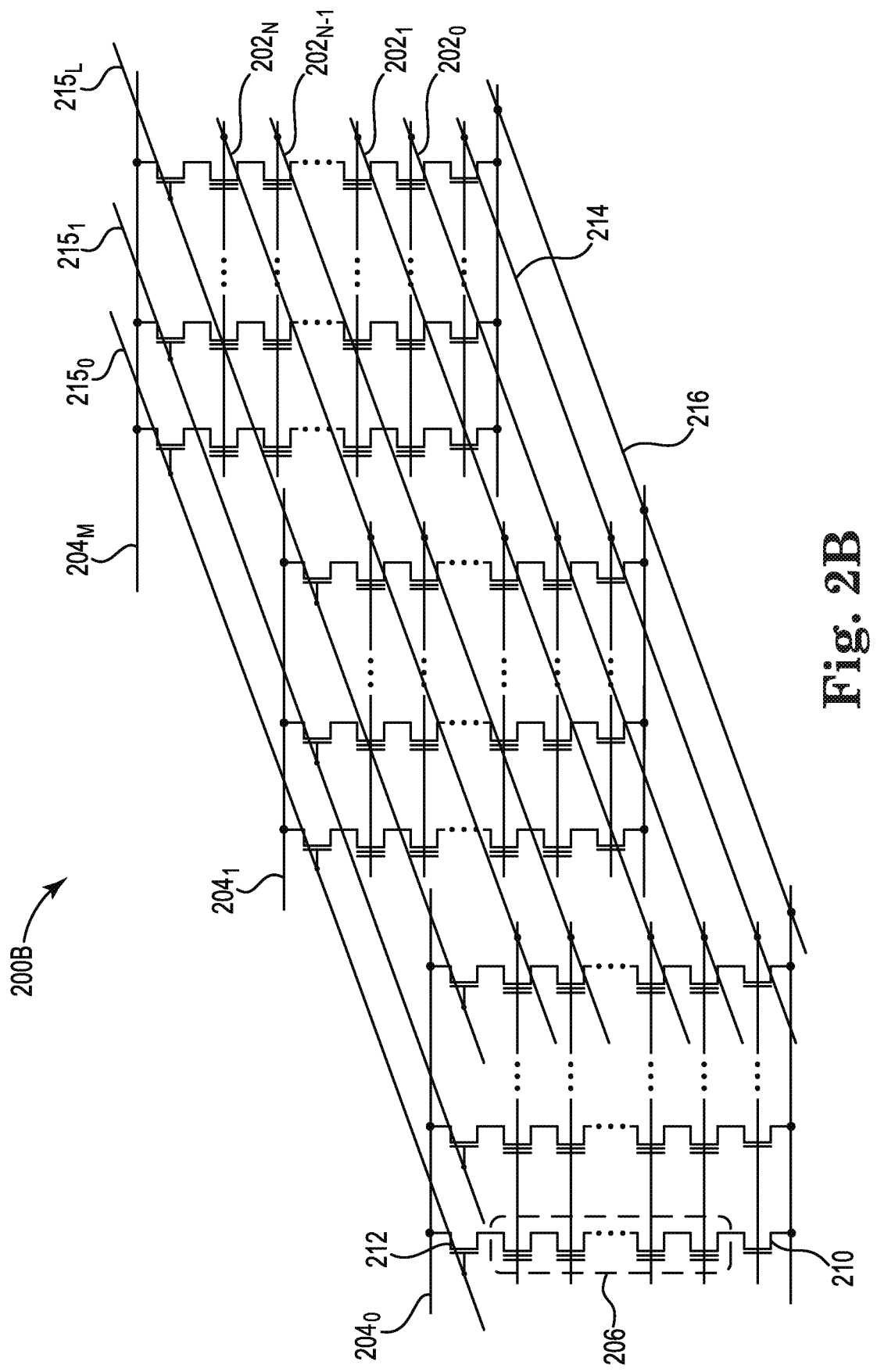

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$ to $204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$ to $215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
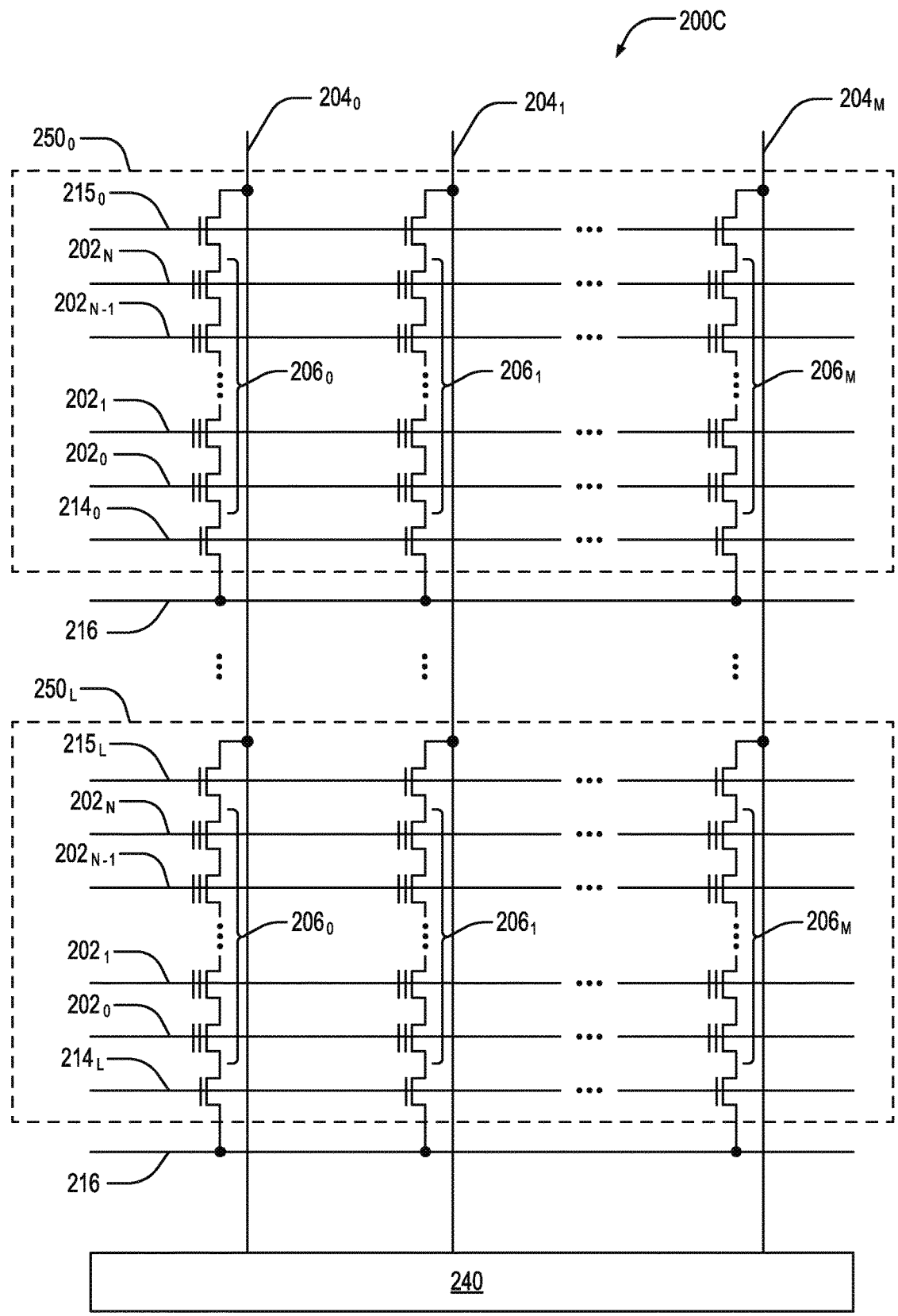

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells 250.

The data lines $204_0$ to $204_M$ may be connected (e.g., selectively connected) to a buffer portion 240, which might be a portion of a page buffer of the memory. The buffer portion 240 might correspond to a memory plane (e.g., the set of blocks of memory cells $250_0$ to $250_L$). The buffer portion 240 might include sensing devices (not shown) for sensing data values indicated on respective data lines 204, and corresponding registers (not shown) for storage of the sensed data values from its corresponding memory plane.

FIG. 2D is a block schematic of a portion of an array of memory cells as could be used in a memory of the type described with reference to FIG. 1. The array of memory cells 260 is depicted to have four memory planes 270 (e.g., memory planes $270_0$ to $270_3$), each in communication with a respective buffer portion 240, which might collectively form a page buffer 272. While four memory planes 270 are depicted, other numbers of memory planes 270 might be commonly in communication with a page buffer 272. Each memory plane 270 is depicted to include L+1 blocks of memory cells 250 (e.g., blocks of memory cells $250_0$ to $250_L$).

Although the examples of FIGS. 2A-2D are discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
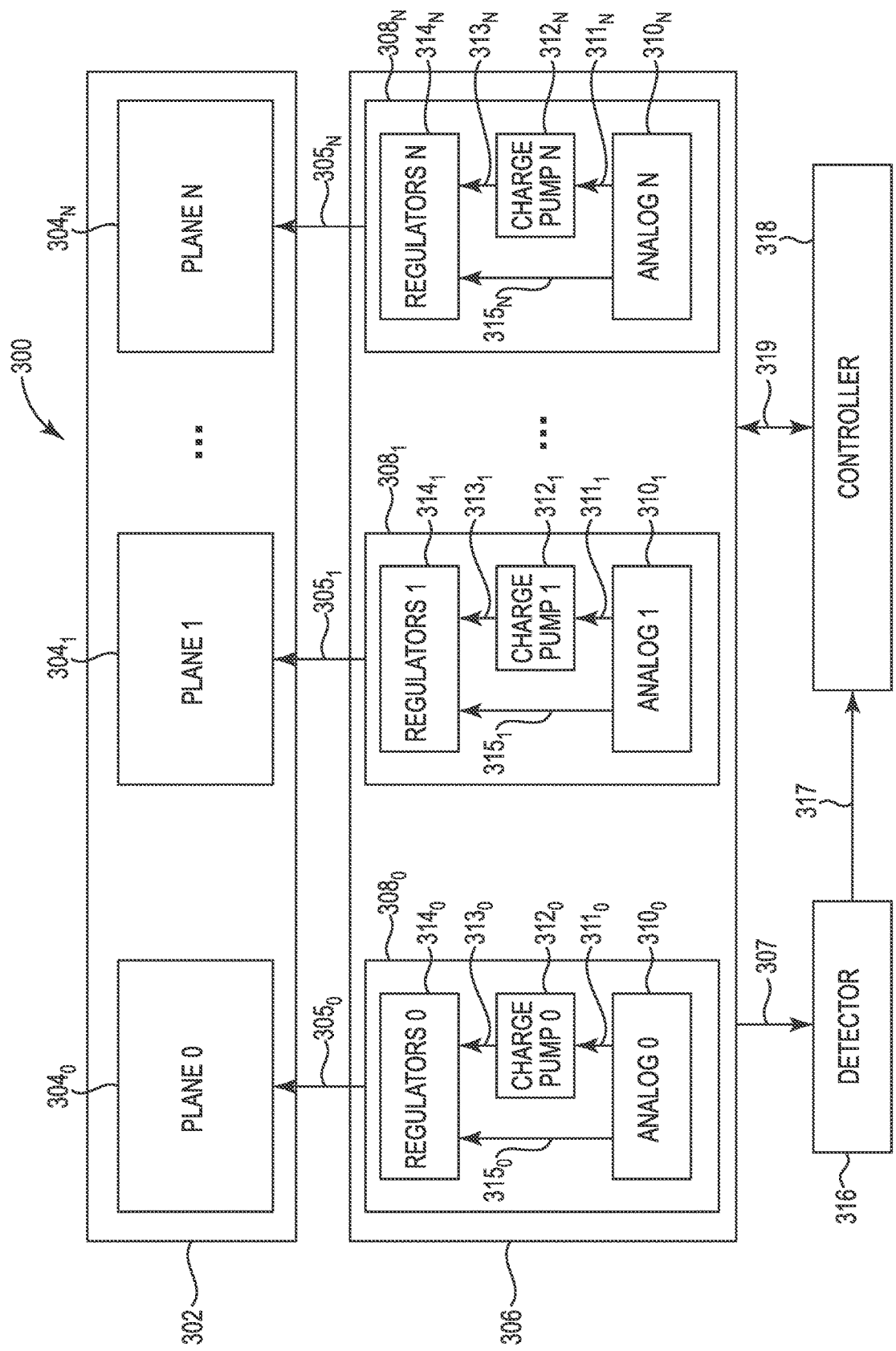
FIG. 3 is a simplified block diagram of another example of a memory device including voltage generation systems.

FIG. 3 is a simplified block diagram of another example of a memory device 300.

Memory device 300 includes a memory array 302, power circuitry 306, a detector 316, and a controller 318. Memory array 302 may include a NAND memory array as previously described and illustrated with reference to FIGS. 2A-2D. Power circuitry 306 and detector 316 may provide part of power circuitry 102 of FIG. 1. Controller 318 may provide part of control logic 116 of FIG. 1.

Memory array 302 may include a plurality of planes $304_0$ to $304_N$, where "N+1" is any suitable number of planes (e.g., 2, 4, 6, 8, or more). Each plane $304_0$ to $304_N$ may be accessed in response to an asynchronous command (e.g., a command to access a single plane of the memory array) or a synchronous command (e.g., a command to access multiple planes of the memory array in parallel). Power circuitry 306 may include a plurality of voltage generation systems $308_0$ to $308_N$. Each voltage generation system $308_0$ to $308_N$ may include an analog circuit $310_0$ to $310_N$, a charge pump $312_0$ to $312_N$, and voltage regulators $314_0$ to $314_N$, respectively. Within each voltage generation system $308_0$ to $308_N$, the analog circuit $310_0$ to $310_N$ may be electrically coupled to the charge pump $312_0$ to $312_N$ through a signal path $311_0$ to $311_N$ and to the voltage regulator $314_0$ to $314_N$ through a signal path $315_0$ to $315_N$, respectively. The charge pump $312_0$ to $312_N$ may be electrically coupled to the voltage regulator $314_0$ to $314_N$ through a signal path $313_0$ to $313_N$, respectively. Each voltage generation system $308_0$ to $308_N$ is electrically coupled to a corresponding plane $304_0$ to $304_N$ through a signal path $305_0$ to $305_N$, respectively. An input of detector 316 is electrically coupled to power circuitry 306 through a signal path 307. An output of detector 316 is electrically coupled to controller 318 through a signal path 317. Controller 318 is electrically coupled to power circuitry 306 through a signal path 319.

Figure 6A:
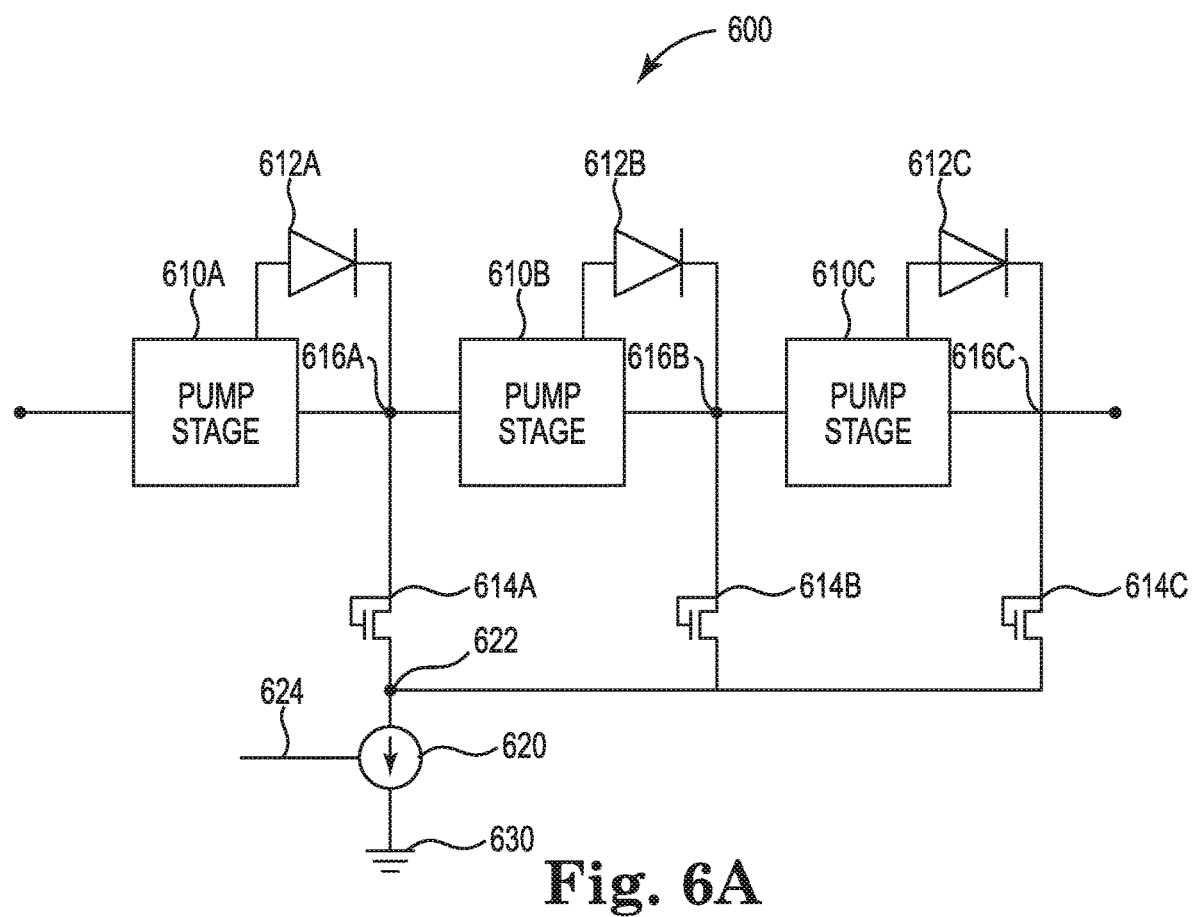
FIGS. 6A-6B are schematic diagrams of one example of a charge pump and discharge circuitry.
Figure 6B:
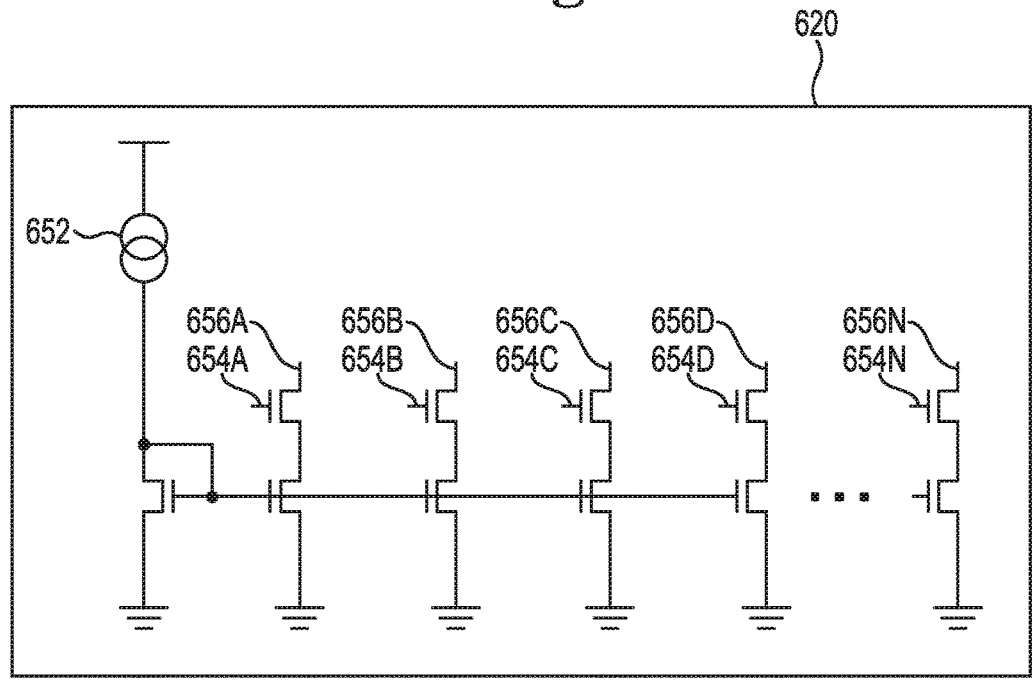

The analog circuit $310_0$ to $310_N$ of each voltage generation system $308_0$ to $308_N$ may receive a supply voltage to provide an input voltage to each charge pump $312_0$ to $312_N$, respectively. Each charge pump $312_0$ to $312_N$, which is described in more detail below with reference to FIGS. 6A-6B, is configured to receive the input voltage and provide an output voltage (e.g., a voltage higher than the input voltage for positive charge pumps or a voltage lower than the input voltage for negative charge pumps) when enabled. Each charge pump $312_0$ to $312_N$ may include multiple stages, with each stage providing a portion of the output voltage. Each stage may include a diode and a capacitance element (e.g., a capacitor), wherein the capacitor is charged and discharged in response to a clock signal. Each charge pump $312_0$ to $312_N$ progressively stores more charge on the capacitor of each successive stage to achieve the desired voltage output. The output voltage of each charge pump $312_0$ to $312_N$ provides an input voltage to the voltage regulators $314_0$ to $314_N$, respectively. Each analog circuit $310_0$ to $310_N$ may provide input voltages to the voltage regulators $314_0$ to $314_N$ for control purposes. The voltage regulators $314_0$ to $314_N$ may receive the input voltages to provide regulated voltages (e.g., a pass gate voltage, a read voltage, and/or a program voltage) to planes $304_0$ to $304_N$, respectively.

As described in more detail below with reference to FIGS. 4-5B, when each voltage generation system $308_0$ to $308_N$ is turned on (e.g., enabled), each charge pump $312_0$ to $312_N$ is enabled to generate the desired output voltage. When each voltage generation system $308_0$ to $308_N$ is turned off (e.g., disabled), each charge pump $312_0$ to $312_N$ is disabled and slowly discharged until each charge pump $312_0$ to $312_N$ reaches an idle state (e.g., discharged state). A plane $304_0$ to $304_N$ of memory array 302 may not be accessed until the charge pump $312_0$ to $312_N$ of the corresponding voltage generation system $308_0$ to $308_N$ is enabled and generating the desired output voltage.

Controller 318 is configured to turn on each voltage generation system $308_0$ to $308_N$ in response to a first command (e.g., an asynchronous command) to access a first plane (e.g., plane $304_0$, $304_1$, . . . or $304_N$) of the plurality of planes $304_0$ to $304_N$. In one example, controller 318 may be configured to turn on the voltage generation system of the plurality of voltage generation systems $308_0$ to $308_N$ corresponding to the first plane of the plurality of planes $304_0$ to $304_N$ in a first power mode, and turn on the remaining voltage generation systems of the plurality of voltage generation systems $308_0$ to $308_N$ corresponding to the other planes of the plurality of planes $304_0$ to $304_N$ in a second power mode configured to consume less power than the first power mode. The first power mode may include operating the charge pump $312_0$ to $312_N$ corresponding to the first plane of the plurality of planes $304_0$ to $304_N$ at a first clock frequency, and operating the charge pumps $312_0$ to $312_N$ corresponding to the other planes of the plurality of planes $304_0$ to $304_N$ at a second clock frequency less than the first clock frequency.

Operating the other voltage generation systems in the second power mode may increase the amount of time needed for the charge pumps of the other voltage generation systems to reach the desired output voltage. Thus, in one example, controller 318 may be configured to, in response to receiving a second asynchronous or synchronous command to access a second plane of the plurality of planes $304_0$ to $304_N$, change the power mode of the voltage generation system of the plurality of voltage generation systems $308_0$ to $308_N$ corresponding to the second plane of the plurality of planes $304_0$ to $304_N$ from the second power mode to the first power mode.

The voltage generation system corresponding to the first plane may be ready within a first period. In one example, the first period is the time from when the voltage generation system is turned on to the time when the charge pump of the voltage generation system reaches the desired output voltage. Controller 318 is configured to execute the first command in response to the first period elapsing. With the first period elapsed and the plurality of voltage generation systems $308_0$ to $308_N$ turned on, controller 318 is configured to execute, without a delay period, any subsequent command to access a corresponding plane of the plurality of planes $304_0$ to $304_N$ in response to the subsequent command.

Controller 318 may be configured to turn off and discharge each voltage generation system of the plurality of voltage generation systems $308_0$ to $308_N$ into an idle state in response to no commands being processed. In one example, discharging each voltage generation system includes discharging the charge pump of each voltage generation system. The idle state may include a fully discharged state such that the capacitance of each stage of the charge pump of each voltage generation system is fully discharged. In other examples, the idle state may include a partially discharged state such that the capacitance of one or more stages of the charge pump of each voltage generation system maintains a residual charge.

Detector 316 is configured to detect a discharge level of the plurality of voltage generation systems $308_0$ to $308_N$. In one example, detector 316 is configured to detect a discharge level of each charge pump $312_0$ to $312_N$ of voltage generation systems $308_0$ to $308_N$. Detector 316 may detect the discharge level of each charge pump $312_0$ to $312_N$ by comparing the output voltage of each charge pump to a reference voltage. The difference between the output voltage and the reference voltage indicates the discharge level of the charge pump.

In one example, with the plurality of voltage generation systems $308_0$ to $308_N$ turned off, controller 318 may be configured to turn on each voltage generation system of the plurality of voltage generation systems $308_0$ to $308_N$ in response to a second command to access a second plane of the plurality of planes $304_0$ to $304_N$. The voltage generation system corresponding to the second plane of the plurality of planes $304_0$ to $304_N$ is ready within a second period. The second period is less than the first period in response to the detected discharge level of the plurality of voltage generation systems $308_0$ to $308_N$ being above a level of the idle state. The second period is the time from when the voltage generation system is turned on to the time when the charge pump of the voltage generation system reaches the desired output voltage.

In another example, with the plurality of voltage generation systems $308_0$ to $308_N$ turned off, controller 318 may be configured to turn on each voltage generation system of the plurality of voltage generation systems $308_0$ to $308_N$ in response to a second command to access a second plane of the plurality of planes $304_0$ to $304_N$. The voltage generation system corresponding to the second plane of the plurality of planes $304_0$ to $304_N$ is ready within the first period in response to the detected discharge level of the plurality of voltage generation systems $308_0$ to $308_N$ being at a level of the idle state.

In yet another example, with the plurality of voltage generation systems $308_0$ to $308_N$ turned off, controller 318 may be configured to turn on each voltage generation system of the plurality of voltage generation systems $308_0$ to $308_N$ in response to a second command to access the first plane of the plurality of planes $304_0$ to $304_N$. The voltage generation system corresponding to the first plane of the plurality of planes $304_0$ to $304_N$ is ready without a delay period in response to the detected discharge level of the plurality of voltage generation systems $308_0$ to $308_N$ being above a level of the idle state.

Accordingly, controller 318 is configured to turn on each voltage generation system of the plurality of voltage generation systems $308_0$ to $308_N$ in response to a first command to access a first plane of the plurality of planes $304_0$ to $304_N$, execute the first command in response to a first period elapsing, and turn off and discharge each voltage generation system of the plurality of voltage generation systems $308_0$ to $308_N$ into an idle state in response to no commands being processed. Controller 318 is configured to execute, without a delay period, a second command to access a second plane of the plurality of planes $304_0$ to $304_N$ in response to the first period being elapsed and with each voltage generation system of the plurality of voltage generation systems $308_0$ to $308_N$ turned on. The first command may include a read operation, a program operation, or an erase operation.

Figure 4:
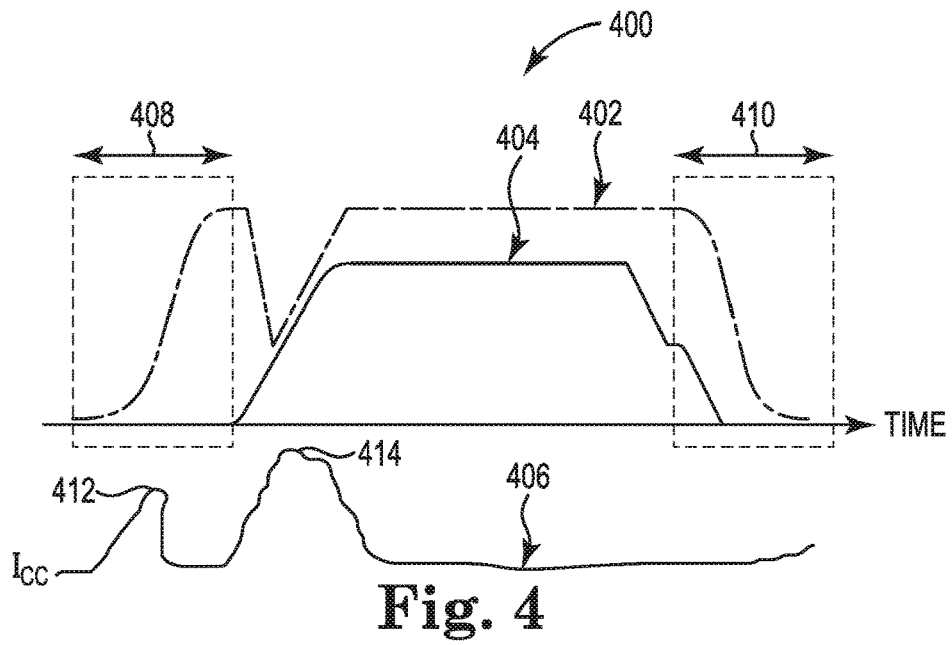
FIG. 4 is a chart illustrating one example of the generation of voltages by voltage generation systems.

FIG. 4 is a chart 400 illustrating one example of the generation of voltages by voltage generation systems, such as a voltage generation system $308_0$ to $308_N$ of FIG. 3. Chart 400 includes a pass gate voltage 402, a word line voltage (e.g., a read voltage) 404, and a current (Icc) 406 versus time. The current 406 indicates the current draw to generate the voltages 402 and 404. When a command (e.g., a read command) is received to access a plane of the memory array, the voltage generation system is turned on and warmed up as indicated at 408. The warm up delay at 408 may be within a range from 1 μs to 2 μs or more to allow the charge pump of the voltage generation system to reach the desired output voltage sufficient to generate the pass gate voltage 402 and the word line voltage 404. Due to the charge pump being charged to generate the desired output voltage during the warm up period at 408, current 406 includes a first peak at 412. Once the charge pump of the voltage generation system has reached the desired output voltage, the pass gate voltage 402 and the word line voltage 404 may be applied to the memory array to perform an operation (e.g., a read operation). When the pass gate voltage 402 and the word line voltage 404 are applied to the memory array, current 406 includes a second peak at 414 due to the charging of the capacitance of the memory array where the pass gate voltage 402 and the word line voltage 404 are applied.

After completing the operation, the voltage generation system may be turned off and the charge pump may be discharged. The discharge period is indicated at 410 and may be within a range of 1 μs to 2 μs or more to allow the charge pump of the voltage generation system to reach the idle state reliably. If the warm up period at 408 and/or the discharge period at 410 could be avoided, the time for completing an operation to access the memory array may be reduced by up to 6% in some embodiments.

Figure 5A:
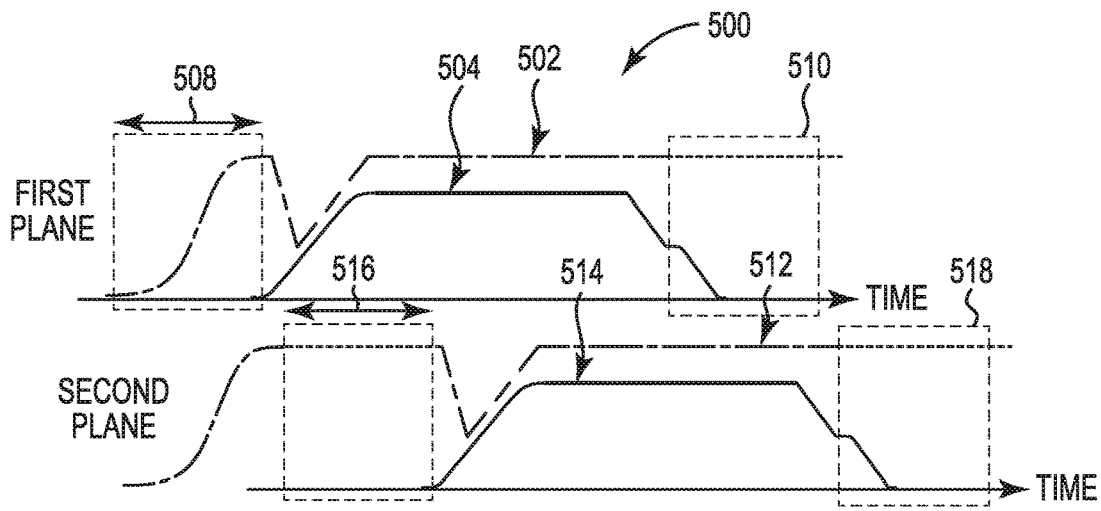
FIGS. 5A-5B are charts illustrating another example of the generation of voltages by voltage generation systems.
Figure 5B:
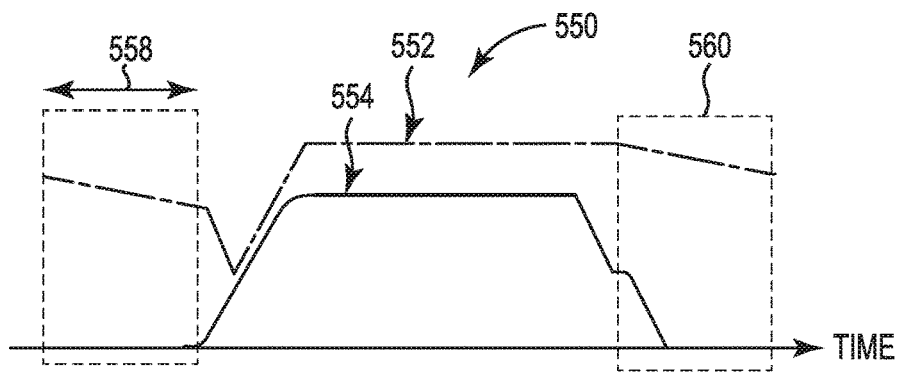

FIGS. 5A-5B are charts illustrating another example of the generation of voltages by voltage generation systems. Chart 500 of FIG. 5A includes a pass gate voltage 502 and a word line voltage (e.g., a read voltage) 504 for a first plane of a memory array and a pass gate voltage 512 and a word line voltage (e.g., a read voltage) 514 for a second plane of the memory array versus time. In response to a first command to access the first plane of the memory array, the voltage generation systems for all planes of the memory array are turned on and warmed up as indicated at 508. The warm up delay at 508 may be within a range from 1 μs to 2 μs or more to allow the charge pumps of the voltage generation systems to reach the desired output voltages sufficient to generate the pass gate voltages and the word line voltages for each plane.

Once the charge pump of the voltage generation system for the first plane to be accessed in response to the first command has reached the desired output voltage, the pass gate voltage 502 and the word line voltage 504 may be applied to the memory array to perform an operation (e.g., a read operation). After completing the operation, if other commands are being processed for accessing any plane of the memory array, the voltage generation system for the first plane (and the other planes) remains on as indicated at 510 instead of being turned off and discharged. In this way, if another command is received to access the first plane, the pass gate voltage 502 and the word line voltage 504 may be applied to the memory array without a delay for the turn on period 508.

In response to a second or subsequent command to access the second plane of the memory array, the pass gate voltage 512 and the word line voltage 514 may be applied to the memory array without a delay for a turn on period at 516 since the voltage generation device for the second plane was already turned on with the first plane during period 508. After completing the operation, if other commands are being processed for accessing any plane of the memory array, the voltage generation system for the second plane (and the other planes) remains on as indicated at 518 instead of being turned off and discharged. In this way, if another command is received to access the second plane, the pass gate voltage 512 and the word line voltage 514 may be applied to the memory array without a delay for the turn on period 508.

As previously described above, the voltage generation system for the first plane to be accessed in response to the first command may be turned on in a first power mode during the turn on period 508, and the voltage generation systems for the other planes may be turned on in a second power mode configured to consume less power than the first power mode. In this case, the turn on period for the other planes may be longer than the turn on period 508 for the first plane. By turning on the voltage generation systems for the other planes in the second power mode, however, the peak current 412 (FIG. 4) during the turn on period may be reduced.

FIG. 5B is a chart 550 indicating the slow discharge of a voltage generated by a voltage generation system prior to turning on the voltage generation system and after turning off the voltage generation system. Chart 550 includes a pass gate voltage 552 and a word line voltage (e.g., a read voltage) 554 for a plane of the memory array versus time. After the voltage generation system has been turned off due to no commands being processed for any plane of the memory array, the voltage generation system is slowly discharged as indicated at 558. If another command is received prior to the voltage generation system reaching the idle state, the voltage generation system is turned on but the turn on period may be reduced since the charge pump of the voltage generation system may take less time to reach the desired output voltage. Once the charge pump of the voltage generation system for the plane to be accessed has reached the desired output voltage, the pass gate voltage 552 and the word line voltage 554 may be applied to the memory array to perform an operation (e.g., a read operation). After completing the operation, if no other commands are being processed for any plane of the memory array, all the voltage generation systems are turned off and slowly discharged into the idle state as indicated at 560. In one example, the voltage generation systems may be slowly discharged into the idle state over a period, for example, of up to 300 μs.

FIG. 6A is a schematic diagram illustrating one example of a charge pump 600. Charge pump 600 may provide each charge pump $312_0$ to $312_N$ of FIG. 3. In this example, charge pump 600 includes pump stages, 610A, 610B, and 610C. In other examples, charge pump 600 may include additional pump stages or fewer pump stages. Pump stages 610A, 610B, and 610C are connected in series, such that an output terminal 616A or 616B of one pump stage is connected to an input of the next pump stage. In this example, an output terminal 616C, from the last pump stage 610C in the illustrated series, is the output terminal of the charge pump 600. Each of these pump stages 610A, 610B, and 610C may include low voltage devices. When disabled, the charge pump 600 may discharge at least a portion of the remaining charge on the pump stages using a trimmable current source 620.

The trimmable current source 620, which is further described below with reference to FIG. 6B, may be connected between a common node 622 and a reference terminal 630. In certain examples, the current provided by the trimmable current source 620 is between 100 microamps and 20 milliamps. The reference terminal 630 may be ground or held at another reference voltage. The trimmable current source 620 may be configured to drain at least a portion of the remaining charge from the pump stages 610A, 610B, and 610C. Accordingly, the current source may include a control input 624 configured to receive information to control (e.g., enable/disable, provide a configurable or selectable current, etc.) the trimmable current source 620. The control input 624 may be connected to the input of the charge pump via an inverter, such that the trimmable current source 620 can be enabled when the charge pump is disabled, and disabled when the charge pump is enabled.

The common node 622 may be common to multiple pump stages, and may be connected to the output terminal 616A, 616B, and 616C of each of the pump stages 610A, 610B, and 610C through passive devices (e.g., diodes) 614A, 614B, and 614C. In various examples, the passive devices 614A, 614B, and 614C may include high voltage devices (e.g., high voltage diodes). The discharge speed may be based on the size of the passive devices 614A, 614B, and 614C, which may vary across examples to vary the discharge speed. The discharge speed may be impacted by the amount of current provided by the trimmable current source 620. The amount of current from the trimmable current source 620 may be selected or configured using a diode transfer curve.

Charge pump 600 may include diodes 612A, 612B, and 612C connected between the output terminals 616A, 616B, and 616C and capacitor nodes within the pump stages 610A, 610B, and 610C. In an example, if a pump stage includes multiple capacitor nodes, the diode for that pump stage may be connected to each capacitor node. In other examples, a pump stage may have one or more diodes with at least one diode connected to each capacitor node. The diodes 612A, 612B, and 612C may help discharge the internal capacitor nodes of the pump stages 610A, 610B, and 610C. When charge pump 600 is working in a step-up mode, diodes 612A, 612B, and 612C allow boosted charge to pass from pump stage 610A to 610B, and from 610B to 610C, etc. Diodes 612A, 612B, and 612C block the reverse path to provide the step-up behavior. However, when pump stages 610A, 610B, and 610C are being discharged, diodes 612A, 612B, and 612C turn-on if the internal voltage of pump stages 610A, 610B, and 610C is higher than the voltage on output terminals 616A, 616B, and 616C, respectively.

The passive devices 614A, 614B, and 614C may not exercise a discharge role when the charge pump is enabled and the trimmable current source 620 is disabled. Further, the diodes 612A, 612B, and 612C may be chosen to minimize current leakage. The number of diodes at each pump stage and the size of the diodes may be selected to ensure that the diodes 612A, 612B, and 612C do not impact the performance of the charge pump. In addition, the diodes 612A, 612B, and 612C do not add significant parasitic capacitance to any internal nodes of the pump stages 610A, 610B, and 610C. Finally, the additional circuitry for controlling the discharge speed (e.g., the trimmable current source 620 and the passive devices 614A, 614B, and 614C, etc.) are relatively small, such that the size of the charge pump is not significantly impacted.

FIG. 6B illustrates one example of the trimmable current source 620 of FIG. 6A. In this example, the current source 620 is a current mirror. A reference current 652 is mirrored by the current mirror 620. Signals 654A-654N may be used on devices of the current mirror 620 to mirror the reference current 652. The signals 654A-654N allow the current mirror to be digitally programmed. Currents 656A-656N may be a multiple of the reference current 652. For example, current 656A may be equal to the reference current 652, current 656B may be equal to two times the reference current 652, current 656C may be equal to four times the reference current 652, current 656D may be equal to eight times the reference current 652, etc.

Figure 7A:
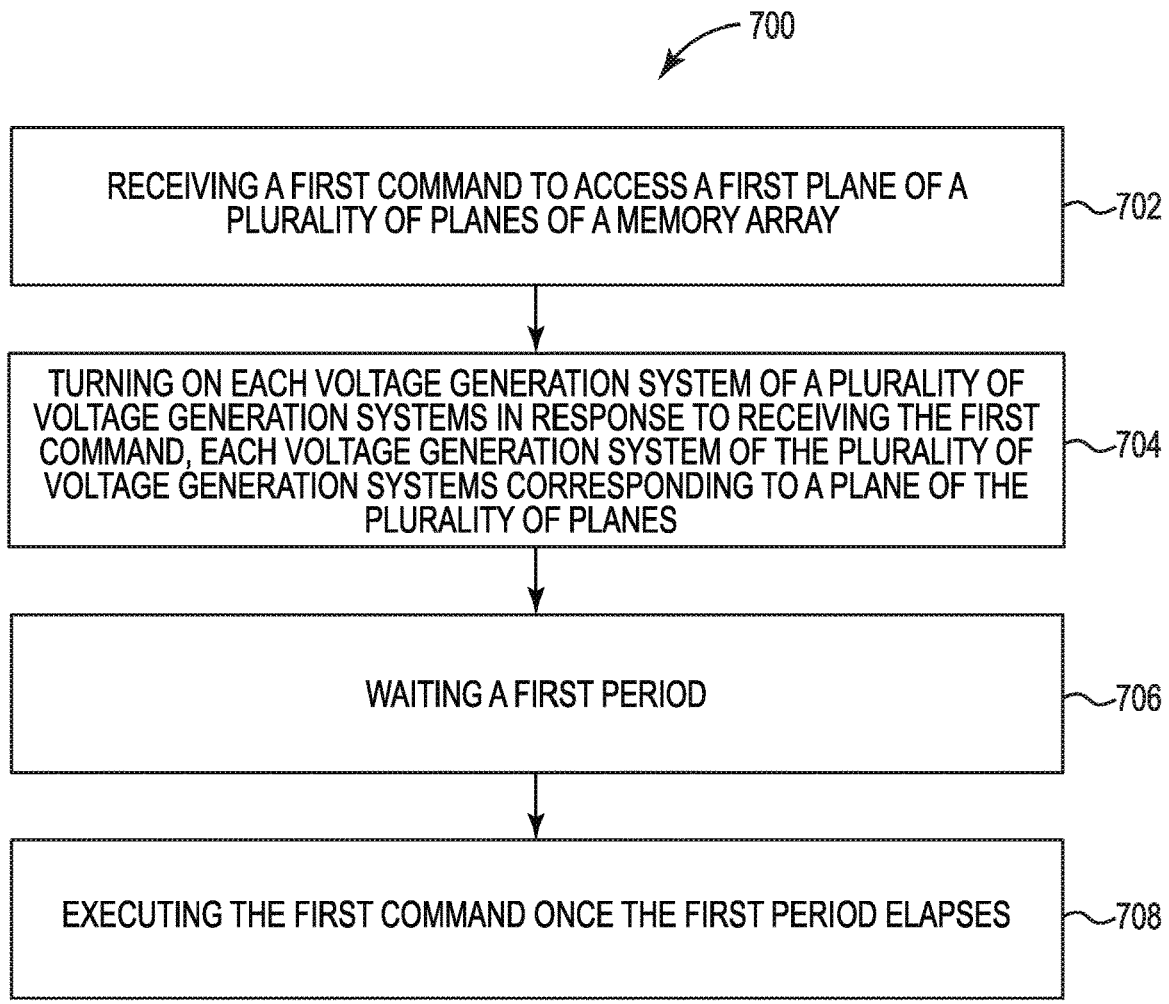
FIGS. 7A-7E are flow diagrams illustrating one example of a method for accessing a memory.

FIGS. 7A-7E are flow diagrams illustrating one example of a method 700 for accessing a memory. In one example, method 700 may be implemented by memory device 100 of FIG. 1 or memory device 300 of FIG. 3. As illustrated in FIG. 7A, at 702 method 700 includes receiving a first command to access a first plane of a plurality of planes of a memory array. At 704, method 700 includes turning on each voltage generation system of a plurality of voltage generation systems in response to receiving the first command, each voltage generation system of the plurality of voltage generation systems corresponding to a plane of the plurality of planes. At 706, method 700 includes waiting a first period. At 708, method 700 includes executing the first command once the first period elapses. In one example, turning on each voltage generation system of the plurality of voltage generation systems in response to receiving the first command includes turning on the voltage generation system corresponding to the first plane of the plurality of planes in a first power mode and turning on the voltage generation systems corresponding to the other planes of the plurality of planes in a second power mode configured to consume less power than the first power mode.

Figure 7B:
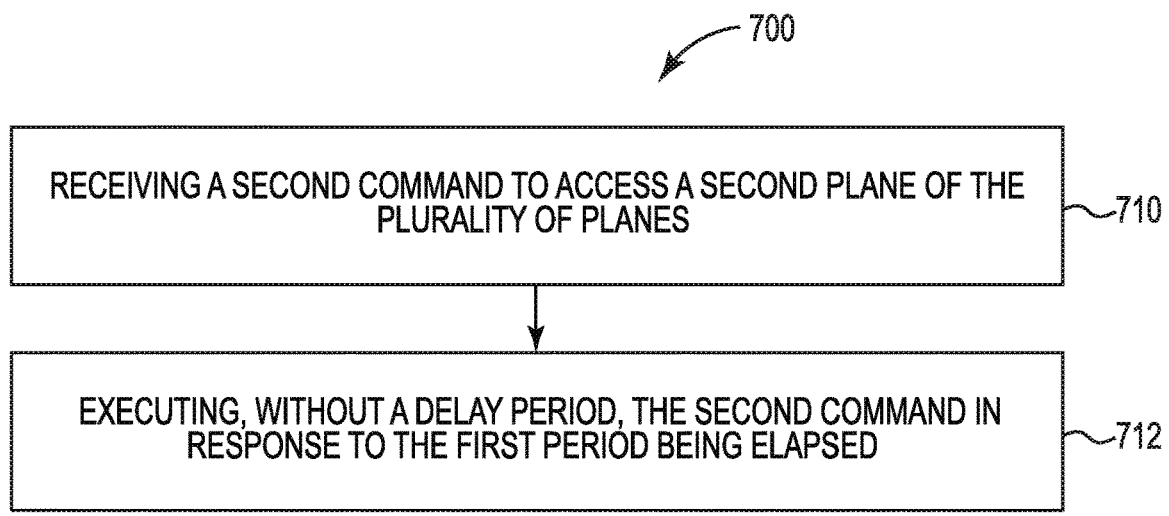
Figure 7C:
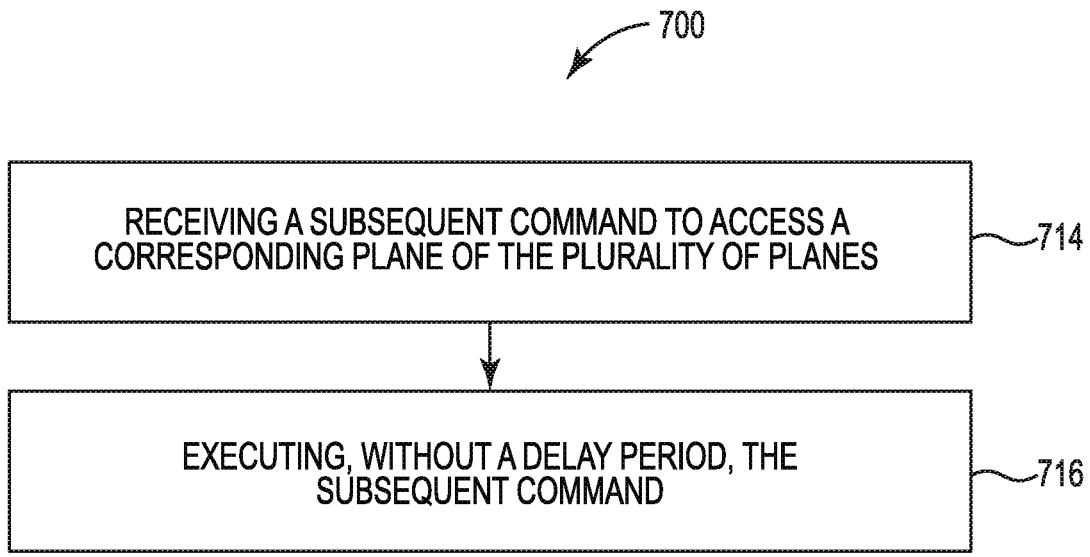
Figure 7D:
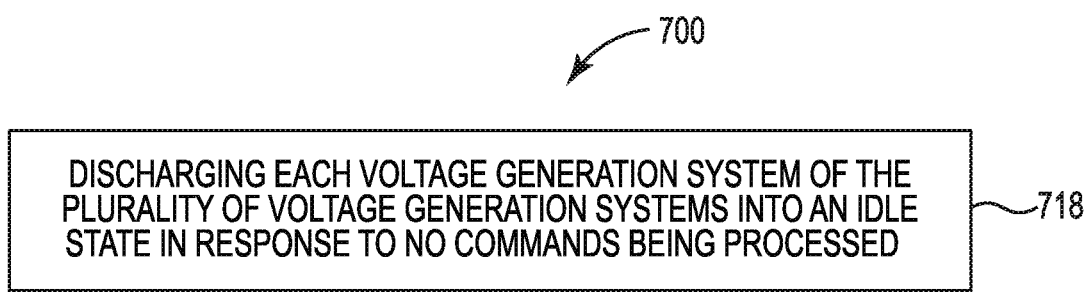

As illustrated in FIG. 7B, at 710 method 700 may further include receiving a second command to access a second plane of the plurality of planes. At 712, method 700 may further include executing, without a delay period, the second command in response to the first period being elapsed. As illustrated in FIG. 7C, at 714 method 700 may further include receiving a subsequent command to access a corresponding plane of the plurality of planes. At 716, method 700 may further include executing, without a delay period, the subsequent command. As illustrated in FIG. 7D, at 718 method 700 may further include discharging each voltage generation system of the plurality of voltage generation systems into an idle state in response to no commands being processed.

Figure 7E:
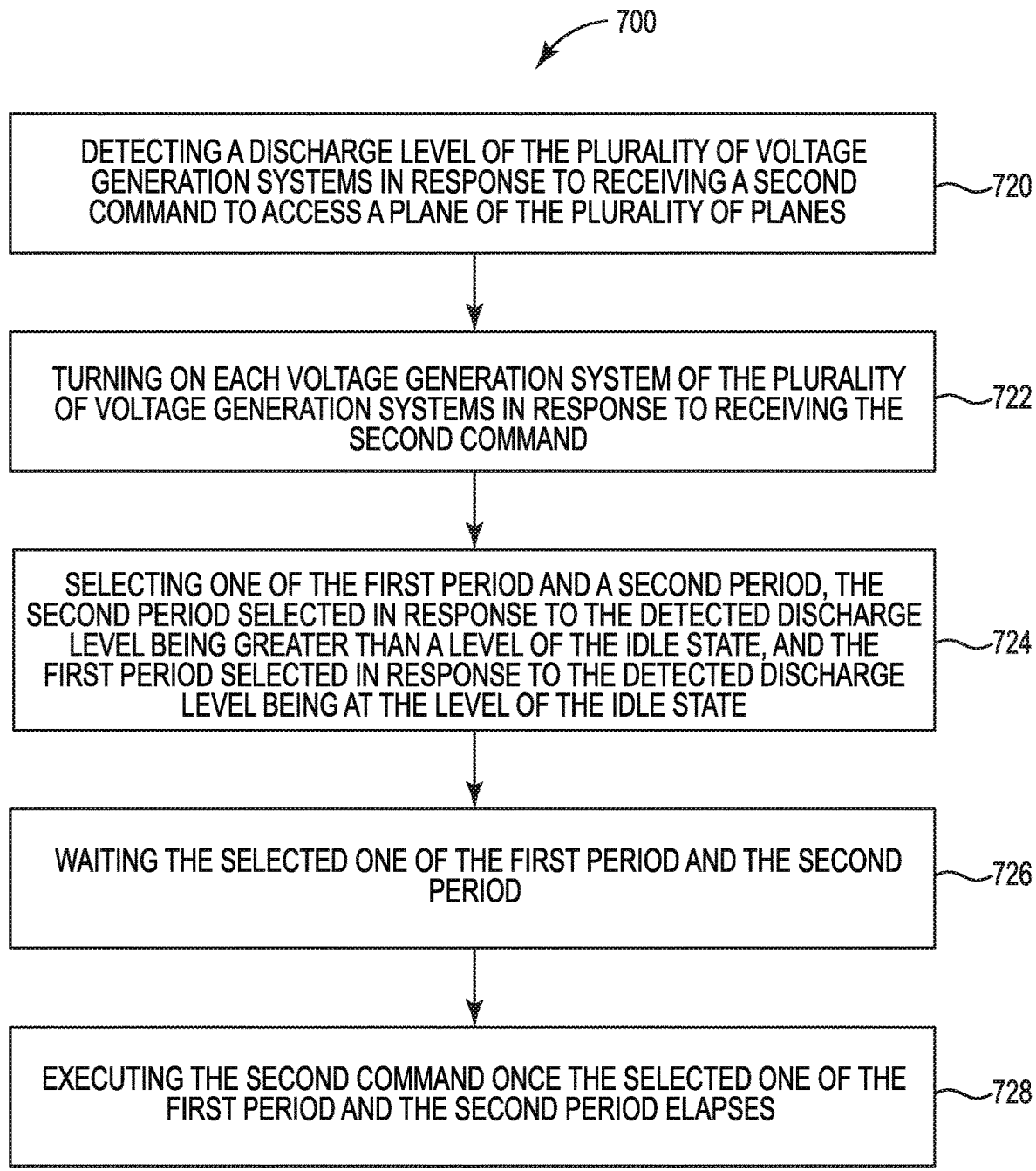

As illustrated in FIG. 7E, at 720 method 700 may further include detecting a discharge level of the plurality of voltage generation systems in response to receiving a second command to access a plane of the plurality of planes. At 722, method 700 may further include turning on each voltage generation system of the plurality of voltage generation systems in response to receiving the second command. At 724, method 700 may further include selecting one of the first period and a second period, the second period selected in response to the detected discharge level being greater than a level of the idle state, and the first period selected in response to the detected discharge level being at the level of the idle state. At 726, method 700 may further include waiting the selected one of the first period and the second period. At 728, method 700 may further include executing the second command once the selected one of the first period and the second period elapses.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
  a memory array comprising a plurality of planes;
  a plurality of voltage generation systems, each voltage generation system of the plurality of voltage generation systems electrically coupled to a corresponding plane of the plurality of planes; and
  a controller configured to turn on each voltage generation system of the plurality of voltage generation systems in response to a first command to access a first plane of the plurality of planes,
  wherein the controller is configured to operate the voltage generation system of the plurality of voltage generation systems corresponding to the first plane of the plurality of planes at a first clock frequency, and operate the remaining voltage generation systems of the plurality of voltage generation systems corresponding to the other planes of the plurality of planes at a second clock frequency less than the first clock frequency.

2. The memory device of claim 1, further comprising:
  a detector configured to detect a discharge level of the plurality of voltage generation systems.

3. The memory device of claim 1, wherein the controller is configured to, in response to receiving a second command to access a second plane of the plurality of planes, change the clock frequency of the voltage generation system of the plurality of voltage generation systems corresponding to the second plane of the plurality of planes to the first clock frequency.

4. The memory device of claim 1, wherein each voltage generation system of the plurality of voltage generation systems comprises:
  an analog circuit to receive a supply voltage and provide an input voltage;
  a charge pump to receive the input voltage and provide an output voltage higher than the input voltage; and
  a regulator to receive the output voltage and provide a regulated voltage to the corresponding plane of the plurality of planes.

5. A memory device comprising:
  a memory array comprising a plurality of planes;
  a plurality of voltage generation systems, each voltage generation system of the plurality of voltage generation systems electrically coupled to a corresponding plane of the plurality of planes and each voltage generation system comprising a corresponding charge pump; and
  a controller configured to turn on each voltage generation system of the plurality of voltage generation systems in response to a first command to access a first plane of the plurality of planes,
  wherein the controller is configured to operate the charge pump corresponding to the voltage generation system of the plurality of voltage generation systems corresponding to the first plane of the plurality of planes at a first clock frequency, and operate the remaining charge pumps corresponding to the voltage generation systems of the plurality of voltage generation systems corresponding to the other planes of the plurality of planes at a second clock frequency less than the first clock frequency.

6. The memory device of claim 5, wherein the controller is configured to, in response to receiving a second command to access a second plane of the plurality of planes, change the clock frequency of the charge pump corresponding to the voltage generation system of the plurality of voltage generation systems corresponding to the second plane of the plurality of planes to the first clock frequency.

7. The memory device of claim 5, wherein the controller is configured to turn off and discharge each voltage generation system of the plurality of voltage generation systems into an idle state in response to no commands being processed.

8. The memory device of claim 5, further comprising:
a detector configured to detect a discharge level of the plurality of voltage generation systems.

9. The memory device of claim 8, wherein the voltage generation system corresponding to the first plane is ready within a first period,
wherein the controller is configured to turn off and discharge each voltage generation system of the plurality of voltage generation systems into an idle state in response to no commands being processed;
wherein with the plurality of voltage generation systems turned off, the controller is configured to turn on each voltage generation system of the plurality of voltage generation systems in response to a second command to access a second plane of the plurality of planes, and
wherein the voltage generation system corresponding to the second plane of the plurality of planes is ready within a second period, the second period being less than the first period in response to the detected discharge level of the plurality of voltage generation systems being above a level of the idle state.

10. The memory device of claim 5, wherein each voltage generation system of the plurality of voltage generation systems comprises a corresponding analog circuit to receive a supply voltage and provide an input voltage to the corresponding charge pump.

11. The memory device of claim 5, wherein each voltage generation system of the plurality of voltage generation systems comprises a corresponding voltage regulator to receive an output voltage from the corresponding charge pump and provide a regulated voltage to the corresponding plane of the plurality of planes.

12. The memory device of claim 5, wherein each charge pump of each voltage generation system of the plurality of voltage generation systems comprises:
a plurality of pump stages; and
a trimmable current source configured to drain at least a portion of a remaining charge from the plurality of pump stages with the charge pump disabled.

13. The memory device of claim 12, wherein the trimmable current source comprises a digitally programmable current mirror.

14. A memory device comprising:
a memory array comprising a plurality of planes;
a plurality of voltage generation systems, each voltage generation system of the plurality of voltage generation systems electrically coupled to a corresponding plane of the plurality of planes;
a detector configured to detect a discharge level of the plurality of voltage generation systems; and
a controller configured to:
receive a first command to access a first plane of the plurality of planes;
turn on each voltage generation system of the plurality of voltage generation systems in response to receiving the first command;
wait a first period; and
execute the first command once the first period elapses.

15. The memory device of claim 14, wherein the controller is configured to:
receive a second command to access a second plane of the plurality of planes; and
execute, without a delay period, the second command in response to the first period being elapsed.

16. The memory device of claim 15, wherein the controller is configured to:
receive a subsequent command to access a corresponding plane of the plurality of planes; and
execute, without a delay period, the subsequent command.

17. The memory device of claim 14, wherein the controller is configured to discharge each voltage generation system of the plurality of voltage generation systems into an idle state in response to no commands being processed.

18. The memory device of claim 17, wherein the controller is configured to:
detect a discharge level of the plurality of voltage generation systems in response to receiving a second command to access a plane of the plurality of planes;
turn on each voltage generation system of the plurality of voltage generation systems in response to receiving the second command;
select one of the first period and a second period, the second period selected in response to the detected discharge level being greater than a level of the idle state, and the first period selected in response to the detected discharge level being at the level of the idle state;
wait the selected one of the first period and the second period; and
execute the second command once the selected one of the first period and the second period elapses.

19. The memory device of claim 14, wherein the controller is configured to:
turn on the voltage generation system corresponding to the first plane of the plurality of planes in a first power mode; and
turn on the voltage generation systems corresponding to the other planes of the plurality of planes in a second power mode configured to consume less power than the first power mode.

20. The memory device of claim 14, wherein the controller is configured to:
turn on the voltage generation system corresponding to the first plane of the plurality of planes at a first clock frequency; and
turn on the voltage generation systems corresponding to the other planes of the plurality of planes at a second clock frequency less than the first clock frequency.

* * * * *